United States Patent [19]
Nakajima et al.

[11] Patent Number: 6,069,538
[45] Date of Patent: May 30, 2000

[54] IMPEDANCE STABILIZING UNIT AND HIGH-FREQUENCY MODULE USING THE UNIT

[75] Inventors: Norio Nakajima, Takatsuki; Takahiro Watanabe, Shiga-ken; Tomonori Ito, Omihachiman; Harufumi Mandai, Takatsuki; Satoshi Ishino, Kusatsu, all of Japan

[73] Assignee: Murata Manufacturing Co., Ltd., Japan

[21] Appl. No.: 09/199,834

[22] Filed: Nov. 25, 1998

[30] Foreign Application Priority Data

Nov. 26, 1997 [JP] Japan .................................. 9-324657
Oct. 28, 1998 [JP] Japan ................................. 10-306934

[51] Int. Cl.⁷ ........................................... H03H 7/40
[52] U.S. Cl. ....................... 333/17.3; 333/32; 455/125
[58] Field of Search ................... 333/17.3, 32; 455/123, 455/125, 193.1, 193.3

[56] References Cited

U.S. PATENT DOCUMENTS

| | | | |
|---|---|---|---|
| 4,381,566 | 4/1983 | Kane | 455/193.3 |
| 4,701,732 | 10/1987 | Nestlerode | 333/32 |
| 5,564,086 | 10/1996 | Cygan et al. | 333/17.3 |
| 5,602,558 | 2/1997 | Urakami et al. | 343/850 |
| 5,783,976 | 7/1998 | Furutani et al. | 333/134 |

*Primary Examiner*—Justin P. Bettendorf
*Attorney, Agent, or Firm*—Ostrolenk, Faber, Gerb & Soffen, LLP

[57] ABSTRACT

An impedance stabilizing unit including an input port; an output port connected to the input unit; an inductance matching circuit connected to ground and at least one of the input port and the output port, the value of the impedance of the inductance matching circuit being adjusted in accordance with a change of the impedance on the side of said output port. The above unit can be made small, realizing a lowered insertion loss.

7 Claims, 4 Drawing Sheets

IMPEDANCE STABILIZING UNIT AND HIGH-FREQUENCY MODULE USING THE UNIT

BACKGROUND OF THE INVENTION

1. Field of the Invention

The present invention relates to an impedance stabilizing unit and a high-frequency module using the unit. More particularly, the present invention relates to an impedance stabilizing unit and a high-frequency module using the unit to be used in the transmission side of a radio equipment.

2. Description of the Related Art

In FIG. 8, a RF block diagram of a portable telephone terminal as a general radio equipment is shown. The portable telephone terminal operating in a single frequency band such as 800 MHz, 1.5 GHz, etc. includes an antenna ANT, a duplexer for antenna DPX, a transmission side radio signal portion Tx, a reception side radio signal portion Rx, and a synthesizer portion SYN. The input of the transmission side radio signal portion Tx is connected to a modulator portion MOD and the output of the reception side radio signal portion Rx is connected to a demodulator portion DE respectively. The transmission side radio signal portion Tx is composed of a high output amplifier PA, a band-pass filter F1, a low-pass filter F2, a mixer MIX1, an isolator ISO, and a directional coupler COU and performs a function to output a transmitting signal in receipt from the modulator MOD to the antenna ANT through the duplexer for antenna DPX. On the other hand, the reception side radio signal portion Rx is composed of a low-noise amplifier LNA, band-pass filters F3, F4, and a mixer MIX2, and carries out a function to output a receiving signal received from the antenna ANT to the demodulator DE through the duplexer for antenna DPX.

Generally, the impedance on the side of an antenna ANT and the impedance on the side of a high output amplifier PA are set to be 50 ohms (Ω) respectively and are made nearly the same, but there are cases that the impedance on the side of the antenna ANT is gradually increased while in use. In those cases, the impedance on the side of the antenna ANT is nearly matched to the impedance on the side of the high output amplifier PA with a current made to flow through the high output amplifier PA. However, if the impedance on the side of the antenna ANT becomes too much different, for example, by breaking of the antenna ANT, the high output amplifier PA breaks down by an excessive current flowing the high output amplifier PA. In order to prevent such a phenomenon and stabilize the impedance on the side of the antenna ANT, an isolator ISO is arranged between the antenna ANT and the high output amplifier PA in the same way as the construction of FIG. 8.

However, in the above-mentioned portable telephone terminal as a radio equipment, there was a problem of having the insertion loss on the transmission side increased, because an isolator ISO is arranged between the antenna ANT and the high output amplifier PA in order to stabilize the impedance on the antenna side.

Further, there was also a problem of being difficult to make the transmission side radio signal portion small-sized, light-weighted, and low-cost.

SUMMARY OF THE INVENTION

The preferred embodiment of the present invention is provided to overcome the above described problems, and is to present a small-sized impedance stabilizing unit to be able to realize a lower insertion loss and a high-frequency module using the unit.

The preferred embodiment of the present invention provides an impedance stabilizing unit, comprising: an input port; an output port connected to said input unit; an inductance matching means connected to a ground and at least one of said input port and said output port; and the value of impedance of said inductance matching means being adjusted in accordance with the change of the impedance on the side of said output port.

According to the above described impedance stabilizing unit, because the value of inductance of an inductance matching means is able to be adjusted in accordance with the change of the impedance on the output port side, the inductance component of a transmission line for a high-frequency signal is able to be adjusted and the impedance on the side of the input port can be kept constant. As a result, the reflection from the output port side to the input port side can be prevented and lowered insertion loss is able to be realized.

In the above described impedance stabilizing unit, said inductance matching means may comprise: a parallel circuit comprising a capacitor and a first inductor connected in series and a diode; and a second inductor connected in series to said parallel circuit.

According to the above structure, because an inductance matching means comprises a parallel circuit made up of a capacitor and a first inductor connected in series and a diode, and a second inductor connected to the parallel circuit in series, by controlling the voltage applied to the diode the impedance component of a transmission line for a high-frequency signal is able to be fine adjusted. As a result, the impedance on the input side can be kept constant more precisely.

In the above described impedance stabilizing unit, said impedance stabilizing unit further may comprise a laminated body formed by laminating a plurality of dielectric layers and having a first major surface, second major surface and a side surface; said diode is mounted on said major surface of said laminated body; and external electrodes constituting said input port and output port are disposed on at least said side surface of said laminated body.

According to the above structure, because a laminated body formed by laminating a plurality of dielectric layers is given, each of parts constituting the inductance matching means is able to be connected on the surface of or inside the laminated body. As a result, the occurrence of excessive inductance component, resistance component, stray capacitance, etc. is able to be prevented.

In the above described impedance stabilizing unit, said impedance stabilizing unit may further comprise a laminated body formed by laminating a plurality of dielectric layers and having a first major surface, a second major surface and a side surface; a first concave portion is disposed on said first major surface or said second major surface of said laminated body; said diode is mounted within said first concave portion; and external electrodes constituting said input port and output port are disposed on at least said side surface of said laminated body.

According to the above structure, because a first concave portion is formed on one major surface of a laminated body constituting the impedance stabilizing unit and the diode constituting the inductance matching means is mounted within the concave portion, a small-sized stabilizer is realized.

The preferred embodiment of the present invention also provides a high-frequency module, comprising: the above described impedance stabilizing unit; and a high output amplifier mounted on said first major surface or second major surface of said laminated body.

According to the above structure, because an impedance stabilizing unit to be able to prevent the reflection from the output port side to the input port side and a high output amplifier are integrated, it is possible to eliminate an isolator for protecting the high output amplifier. As a result, the transmission side radio signal portion of a portable telephone terminal is able to be made small-sized and as the result the portable telephone terminal as a radio equipment can be made small-sized.

Further, because the input of the impedance stabilizing unit and the output of the high output amplifier are connected on the surface of and inside the laminated body, the loss by wiring is able to be reduced and as the result harmonic disturbance can be prevented.

The preferred embodiment of the present invention also provides a high-frequency module, comprising: the above described impedance stabilizing unit; a second concave portion disposed on at least one of said first major surface and second major surface of said laminated body; and a high output amplifier mounted within said second concave portion.

According to the above high-frequency module, because a high output amplifier is mounted in a second concave portion formed on at least either of a first major surface and a second major surface of the laminated body, the small-sized high-frequency module is realized.

Other features and advantages of the present invention will become apparent from the following description of invention which refers to the accompanying drawings.

DETAILED DESCRIPTION OF THE PREFERRED EMBODIMENT

Figure 1:
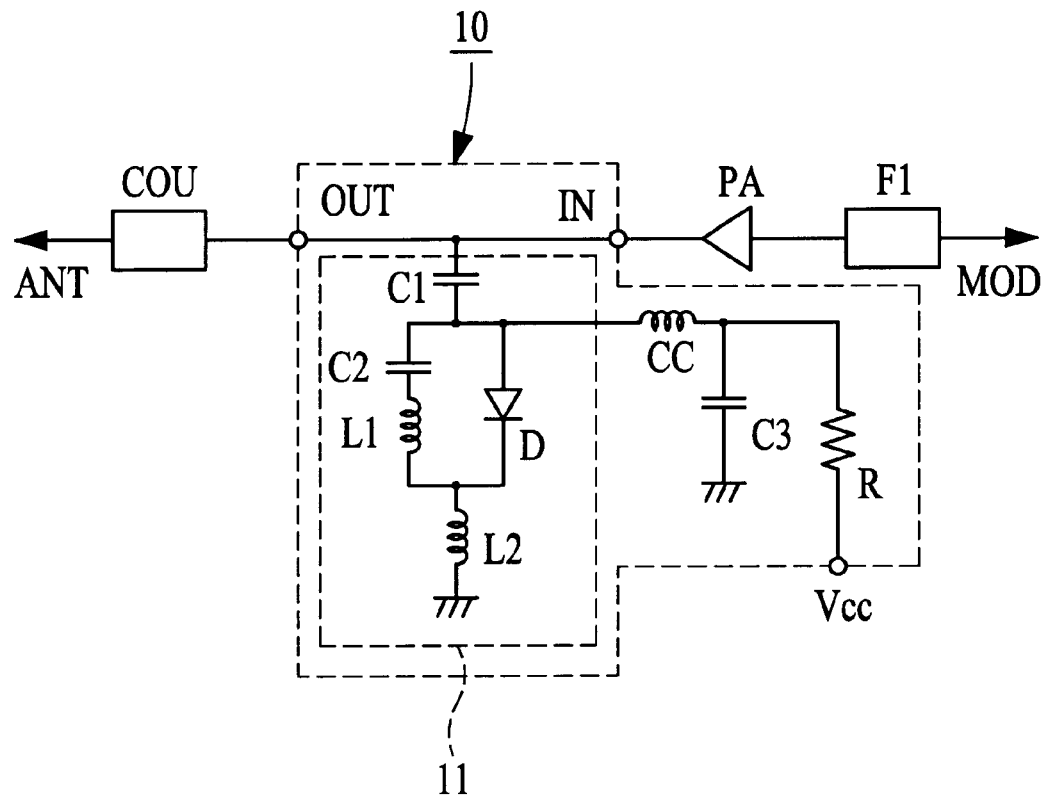
FIG. 1 shows the construction of one preferred embodiment of an impedance stabilizing unit according to the present invention.

FIG. 1 shows the construction of one preferred embodiment of an impedance stabilizing unit according to the present invention. The impedance stabilizing unit 10 is composed of an input port IN and output port OUT, and an inductance matching means 11 is connected between the input port and output port and the ground. The inductance matching means 11 is composed of a capacitor C1, a capacitor C2 and an inductor L1 connected in series and a diode D connected in parallel, and an inductor L2, all of which are connected in series.

And to the connection point between the capacitor C2 and the anode of the diode D, a controlling terminal Vcc to apply a voltage to the diode D through a choke coil CC and a resistor R is connected. Further, between the connection point of the choke coil CC and resistor R and the ground a capacitor C3 is connected.

In practice, when the impedance stabilizing unit is used in the transmission side radio signal portion Tx, as shown in FIG. 1 the input port IN is connected to the output of the high output amplifier PA and the output port OUT is connected to the input of the directional coupler COU.

Further, the choke coil CC functions to prevent leakage of a high-frequency signal to the controlling terminal Vcc when a voltage is applied to the diode D. Furthermore, the resistor R functions to adjust the amplitude of a voltage applied to the diode D.

Under the above construction, the value of inductance of the inductance matching means 11 is adjusted in accordance with the change of the impedance on the side of the output port OUT.

Specifically, the output value of the high output amplifier PA connected to the side of the input port IN changing in accordance with the change of impedance on the side of the output port OUT, or the output value of the directional coupler COU connected to the side of the output port OUT is fed back to the controlling terminal Vcc, and the voltage applied to the diode D is controlled. As the result, when the diode D is turned on, a current flows on the side of the diode D and the value of inductance of the inductance matching means 11 turns to the value of the inductor L2. On the other hand, when the diode D is turned off, a current flows on the side of the series circuit made up of the capacitor C2 and the inductor L1 and the value of inductance of the inductance matching means 11 turns to the composite value of the inductor L1 and inductor L2. Accordingly, by on-off control of the diode D the value of inductance of the inductance matching means 11 can be adjusted.

More, if a varactor diode is used for the diode D, the ratio between the current flowing on the side of the diode D and the current flowing on the side of the series circuit made up of the capacitor C2 and the inductor Li can be continuously changed. Therefore, the value of inductance of the inductance matching means 11 can be also continuously changed.

Further, when a variable resistor is used for the resistor R connected between the connection point of the capacitor C2 and anode of the diode and the controlling terminal Vcc and the value of the resistor R is continuously changed in accordance with the output value of the high output amplifier PA or the output value of the directional coupler COU, even if the voltage from the controlling terminal Vcc is constant, the voltage applied to the diode D can be continuously controlled and as the result the value of inductance of the inductance matching means 11 can be also continuously adjusted in the same way as the case in which a varactor diode is used for the diode D.

Figure 2:
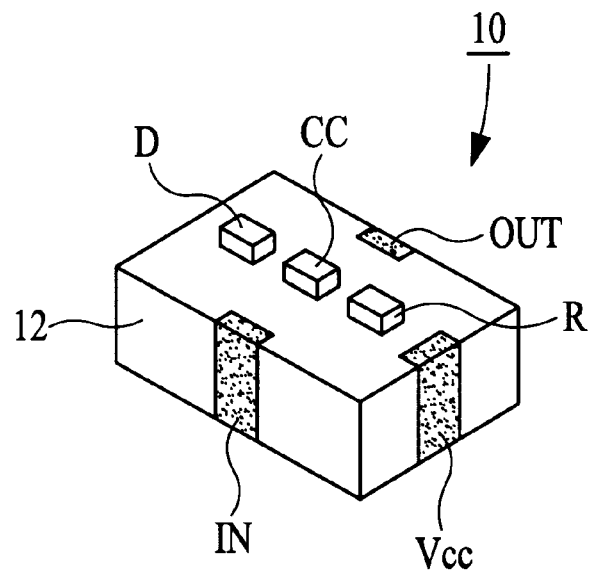
FIG. 2 is a perspective view of an impedance stabilizing unit given the construction of FIG. 1.

FIG. 2 shows a perspective view of an impedance stabilizing unit having the construction in FIG. 1. The impedance stabilizing unit 10 includes a laminated body 12 internally storing electrodes (not illustrated) to form capacitors C1 through C3 and inductors L1 and L2. The laminated body 12 is formed by laminating a plurality of dielectric layers (not illustrated). And on one major surface (a first major surface) of the laminated body 12, a diode D, a choke coil CC, and a resistor are mounted.

Furthermore, an input port IN is given from the vicinity of one long edge of the top surface of a laminated body 12 to the vicinity of one long edge of the back surface through a side surface next to one long edge, an output port OUT from the vicinity of the other long edge of the top surface to the vicinity of the other long edge of the back surface through a side surface next to the other long edge, and a controlling terminal Vcc from the vicinity of one short edge of the top surface to the vicinity of one short edge of the back surface through a side surface next to one short edge respectively.

More, the electrodes forming capacitors C1 through C3 and inductors L1 and L2 are connected inside the laminated body 12 through via-holes, through holes, etc.

Here, the value of the reflection loss at the time when the impedance (Z=R+jX) on the side of the output port OUT has been changed is shown in Table 1.

TABLE 1

| R | X | Reflection loss (dB) | Insertion loss (dB) |
|---|---|---|---|
| 30 | 0 | −11.3 | −0.34 |
| 30 | 30 | −7.61 | −1.83 |
| 50 | 0 | −30.9 | −0.0060 |
| 50 | 50 | −8.47 | −1.9 |
| 50 | −50 | −14.8 | −1.6 |
| 200 | 0 | −8.86 | −3.3 |
| 200 | 200 | −5.82 | −5.7 |
| 200 | −200 | −6.56 | −5.5 |
| 230 | −30 | −13.5 | −0.30 |

From Table 1, it is understood that the generally required condition of the insertion loss of less than −4 dB is met even if the impedance on the side of the output port OUT has been changed and the reflection from the output port OUT to the input port IN is prevented. This is because even if the impedance on the side of the output port OUT has been changed, the impedance on the side of the input port is kept nearly constant.

As described above, by use of the impedance stabilizing unit of the above-mentioned embodiment, the value of inductance of the inductance matching means is able to be adjusted in accordance with the change of the impedance on the side of the output port, and accordingly the impedance component of a transmission line for a high-frequency signal is able to be adjusted and the impedance on the input port side is able to be kept constant. Therefore, because the reflection from the side of the output port to the side of the input port is able to be prevented, it is possible to realize a lower insertion loss.

Further, by adjusting the voltage applied to the diode, the inductance component of a transmission line for a high-frequency signal is able to be fine-adjusted. Accordingly, the impedance on the input side is able to be kept constant more precisely.

Furthermore, because a laminated body made up of a plurality of dielectric layers laminated is given, capacitors and inductors constituting the inductance matching means can be connected on the surface of and inside the laminated body through end-surface electrodes, through-holes, or via-holes. Therefore, the occurrence of excessive inductance components, resistor components, stray capacitance can be prevented and at the same time it becomes possible to form an inductance of a high Q, and also it is possible to precisely set the ratio of the inductor connected to the diode in parallel to the inductor connected in series to the diode.

Figure 3:
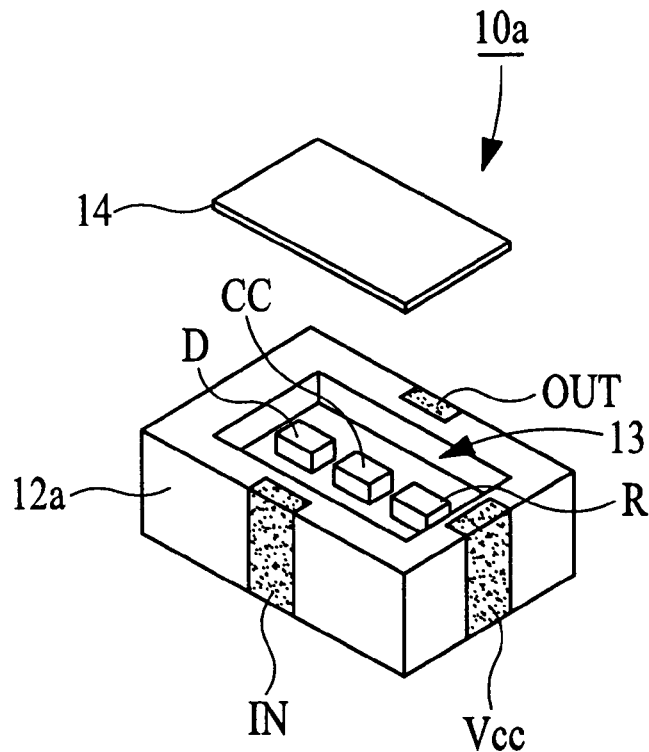
FIG. 3 is a perspective view of another impedance stabilizing unit given the construction of FIG. 1.

In FIG. 3 shows a perspective view of another impedance stabilizing unit having the construction shown in FIG. 1. The impedance stabilizing unit 10a is different in that a diode D, a choke coil CC, and a resistor R are mounted in a first concave portion 13 given on one major surface (a first major surface) of a laminated body 12a with electrodes constituting capacitors C1 through C3 and inductors L1 and L2 (not illustrated) internally stored and in that the first concave portion 13 is completely sealed with a metal cap 14 from the impedance stabilizing unit 10 in FIG. 2.

In this case, a diode, a choke coil, and a resistor made up of chip parts are mounted within the concave portion given on one major surface of the laminated body, and accordingly a small-sized stabilizer is realized.

More, even if a plurality of first concave portions with a diode, a choke coil, and a resistor mounted are given on one major surface of a laminated body and a diode, a choke coil, and a resistor are separately mounted in each of the concave portions, the same effect can be obtained.

Figure 4:
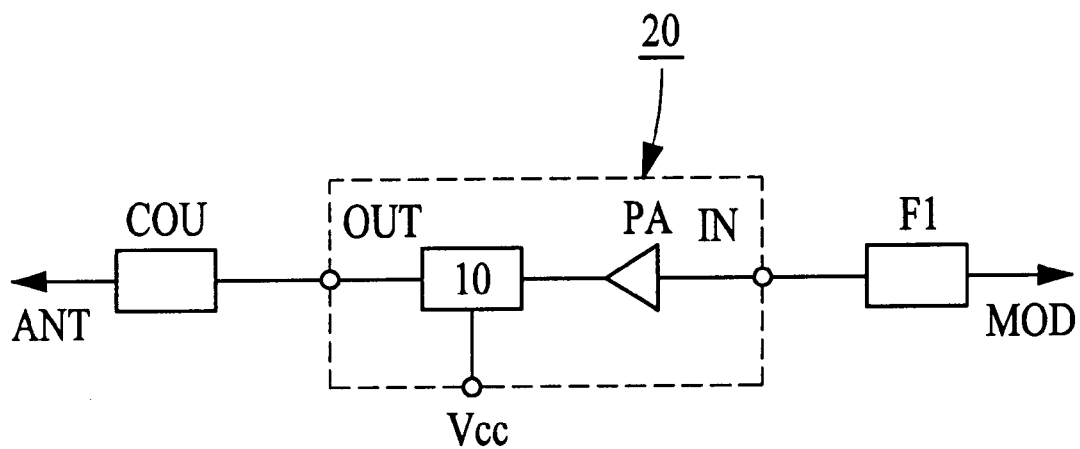
FIG. 4 shows the construction of one preferred embodiment of a high-frequency module according to the present invention.

FIG. 4 shows the construction of one preferred embodiment of a high-frequency module according to the present invention. The high-frequency module has an input port IN and an output port OUT given, and between the input port IN and the output port OUT an impedance stabilizing unit 10 and a high output amplifier PA are connected. Further, to the impedance stabilizing unit 10, a controlling terminal Vcc for applying a voltage to a diode (not illustrated) constituting an inductance matching means in the impedance stabilizing unit 10 is connected. And the input of the impedance stabilizing unit 10 and the output of the high output amplifier PA are connected inside the high-frequency module 20.

Practically, when the high-frequency module 20 is used in the transmission side radio signal portion Tx, as shown in FIG. 4 the input port IN is connected to the output of a band-pass filter F1 and the output port OUT is connected to the input of a directional coupler COU.

Figure 5:
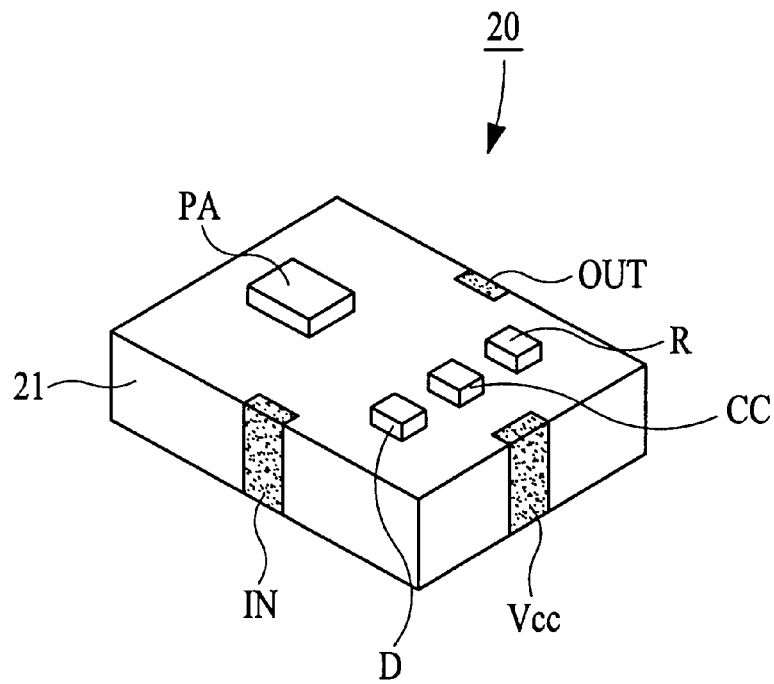
FIG. 5 is a perspective view of a high-frequency module having the construction of FIG. 4.

FIG. 5 shows a perspective view of a high-frequency module having the construction of FIG. 4. In the high-frequency module 20, a laminated body 21 internally storing capacitors C1 through C3 and inductors L1 and L2 (not illustrated) constituting the impedance stabilizing unit 10 is given, and on one major surface (a first major surface) of the laminated body 21, a diode D, a choke coil Cc, and a resistor R as chip parts constituting the impedance stabilizing unit 10 and a high output amplifier PA are mounted.

Further, an input port IN as the input to the high output amplifier PA is given from the vicinity of one long edge of the top surface of a laminated body 21 to the vicinity of one long edge of the back surface through a side surface next to one long edge, an output port OUT as the output of the impedance stabilizing unit from the vicinity of the other long edge of the top surface to the vicinity of the other long edge of the back surface through a side surface next to the other long edge, and a controlling terminal Vcc connected to the impedance stabilizing unit 10 from the vicinity of one short edge of the top surface to the vicinity of one short edge of the back surface through a side surface next to one short edge respectively. More, the input of the impedance stabilizing unit and the output of the high output amplifier PA are connected on the surface of or inside the laminated body 21.

As described above, in the high-frequency module of the above-mentioned embodiments because the impedance stabilizing unit to prevent the reflection from the output side to the input side and the output amplifier are integrated, an isolator for protecting the high output amplifier can be omitted. Accordingly, the transmission side radio signal portion of a portable telephone terminal is able to be small-sized and as the result the portable telephone terminal as a radio equipment can be made small-sized.

Further, because the input of the impedance stabilizing unit and the output of the high output amplifier are connected on the surface of or inside the laminated body, the loss by wiring is able to be reduced and as the result or harmonic disturbance can be prevented.

Figure 6:
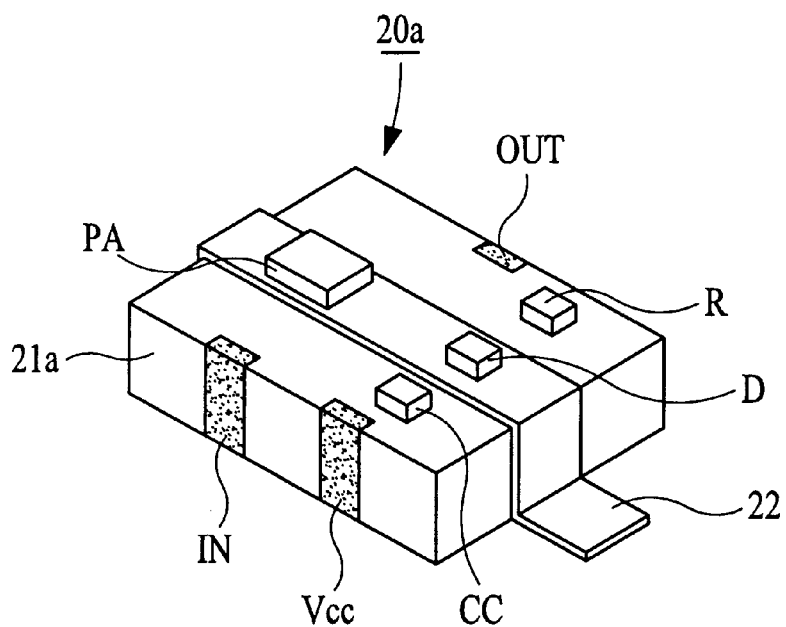
FIG. 6 is a perspective view of another high-frequency module having the construction in FIG. 4.

FIG. 6 shows a perspective view of another high-frequency module of the construction in FIG. 4. The high-frequency module 20a is different from the high-frequency module 20 in FIG. 5 in that a metal ground plate 22 is arranged from one side surface of side surfaces facing each other of a laminated body 21a internally containing capacitors C1 through C3 and L1 and L2 (not illustrated) constituting an impedance stabilizing unit 10 to the other side surface through one major surface (a first major surface) and in that a diode D and a high output amplifier PA constituting the impedance stabilizing unit 10 are mounted on the ground plate 22.

In this case, the heat produced in the high output amplifier is able to be removed through the ground plate and accordingly the operation of the high output amplifier can be stabilized.

Figure 7:
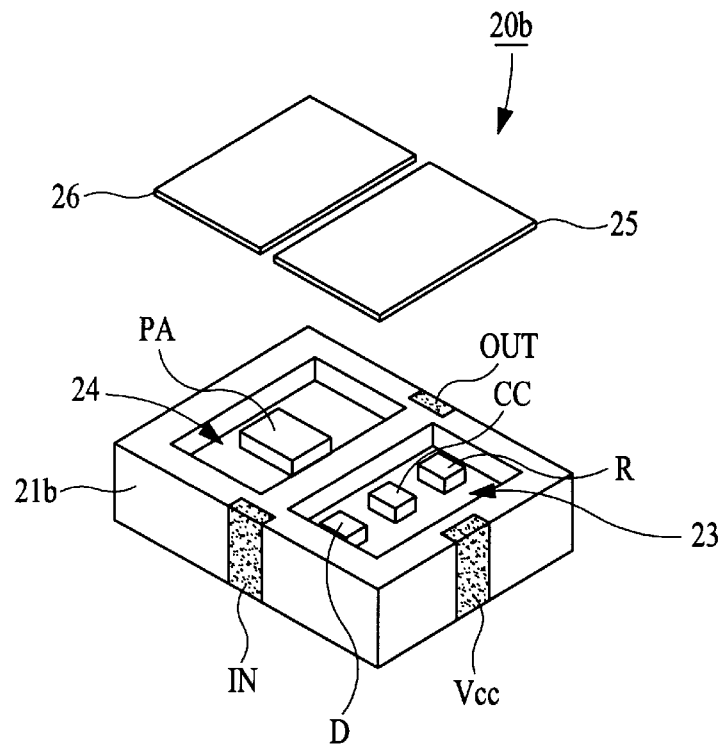
FIG. 7 is a perspective view of further another high-frequency module having the construction in FIG. 4.
Figure 8:
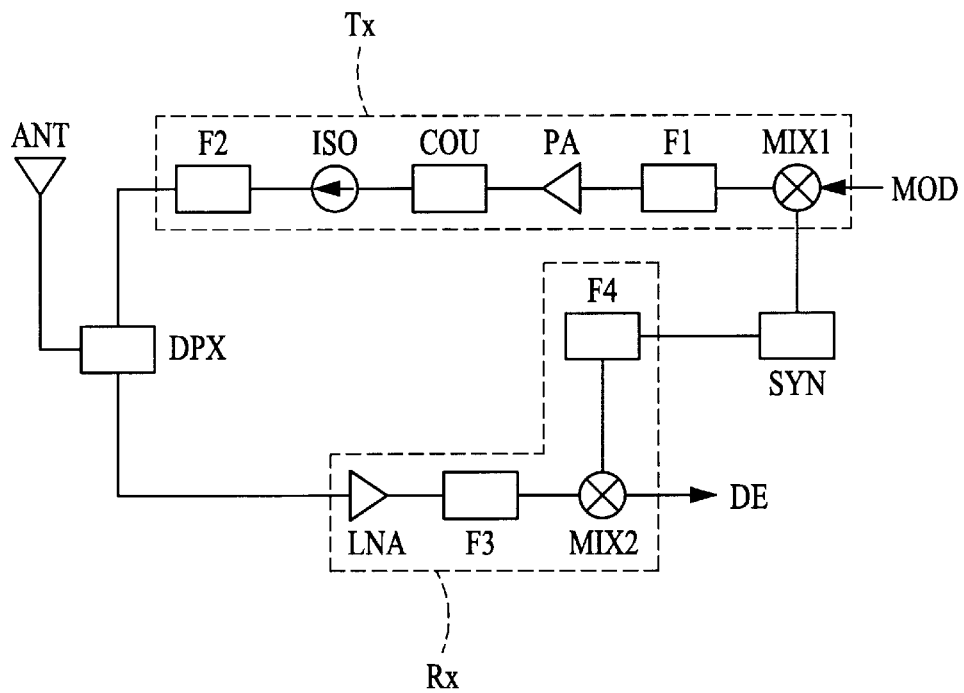
FIG. 8 is an RF block diagram of a portable telephone terminal as a general radio equipment.

FIG. 7 shows a perspective view of further another high-frequency module having the construction in FIG. 4. In the high-frequency module 20b, a laminated body 21b internally storing capacitors C1 through C3 and inductors L1 and L2 (not illustrated) constituting the impedance stabilizing unit 10 is given, and on one major surface (a first major surface) of the laminated body 21b a first concave portion 23 and a second concave portion 24 are disposed and at the same time in the first concave portion 23 a diode D, a choke coil CC, and a resistor R are mounted and in the second concave portion a high output amplifier PA is mounted respectively. And the first and second concave portions 23, 24 are completely sealed with metal caps 25, 26.

In this case, a diode, a choke coil, and a resistor as chip parts constituting the impedance stabilizing unit and a high output amplifier are mounted in a first concave portion and a second concave portion given on one major surface of the laminated body, and accordingly a small-sized high-frequency module is realized.

Further, because the second concave portion in which a high output amplifier has been mounted is completely sealed, a stable characteristic and reduced degradation of the high output amplifier is realized.

Furthermore, even if a via-hole is given just under the high output amplifier in the laminated body to dissipate the heat generated in the high output amplifier through the via-hole, the same effect can be obtained.

More, even if a first concave portion in which a diode, a choke coil, and a resistor constituting the impedance stabilizing unit are mounted and a second concave portion in which a high output amplifier is mounted are separately formed on one major surface (a first major surface) and the other major surface (a second major surface) of a laminated body respectively, the same effect can be obtained.

More, like the high-frequency module shown in FIG. 6, a diode and a high output amplifier constituting an impedance stabilizing unit may be mounted on a metal ground plate arranged. In this case, the same effect as the high-frequency module in FIG. 5 is also obtained in addition to the above-mentioned effect.

While the invention has been particularly shown and described with reference to preferred embodiments thereof, it will be understood by those skilled in the art that the forgoing and other changes in form and details may be made therein without departing from the spirit of the invention.

What is claimed is:

1. An impedance stabilizing unit, comprising:
   an input port;
   an output port connected to said input port;
   an inductance matching circuit connected to a ground and to at least one of said input port and said output port; and
   the value of impedance of said inductance matching circuit being adjusted in accordance with a change of impedance on the side of said output port;
   wherein said impedance stabilizing unit further comprises a laminated body formed by laminating a plurality of dielectric layers and having a first major surface, a second major surface and a side surface;
   a first concave portion is disposed on said first major surface or said second major surface of said laminated body;
   a diode is mounted within said first concave portion; and
   external electrodes constituting said input port and output port are disposed on at least said side surface of said laminated body.

2. A high-frequency module, comprising:
   said impedance stabilizing unit according to claim 1; and
   a high output amplifier mounted on said first major surface or second major surface of said laminated body.

3. A high-frequency module, comprising:
   said impedance stabilizing unit according to claim 1;
   a second concave portion disposed on at least one of said first major surface and second major surface of said laminated body; and
   a high output amplifier mounted within said second concave portion.

4. A high-frequency module, comprising:
   an impedance stabilizing unit, comprising:
   an input port;
   an output port connected to said input port;
   an inductance matching circuit connected to a ground and to at least one of said input port and said output port; and
   the value of impedance of said inductance matching circuit being adjusted in accordance with a change of impedance on the side of said output port;
   wherein said impedance stabilizing unit further comprises a laminated body formed by laminating a plurality of dielectric layers and having a first major surface, second major surface and a side surface;
   a diode is mounted on one of said first and second major surface of said laminated body; and external electrodes constituting said input port and output port are disposed on at least said side surface of said laminated body;
   wherein a concave portion is disposed on at least one of said first major surface and second major surface of said laminated body; and
   wherein a high output amplifier is mounted within said concave portion.

5. An impedance stabilizing unit, comprising:
   an input port;
   an output port connected to said input port;
   an inductance matching circuit connected to a ground and to at least one of said input port and said output port; and
   the value of impedance of said inductance matching circuit being adjusted in accordance with a change of impedance on the side of said output port:

wherein said inductance matching circuit comprises: a parallel circuit comprising a capacitor and a first inductor connected in series, and a diode; and a second inductor connected in series to said parallel circuit; and wherein said impedance stabilizing unit further comprises a laminated body formed by laminating a plurality of dielectric layers and having a first major surface, a second major surface and a side surface;

a first concave portion is disposed on said first major surface or said second major surface of said laminated body;

said diode is mounted within said first concave portion; and external electrodes constituting said input port and output port are disposed on at least said side surface of said laminated body.

6. A high-frequency module, comprising:

said impedance stabilizing unit according to claim 5; and a high output amplifier mounted on said first major surface or second major surface of said laminated body.

7. A high-frequency module, comprising:

said impedance stabilizing unit according to claim 5;

a second concave portion disposed on at least one of said first major surface and second major surface of said laminated body; and a high output amplifier mounted within said second concave portion.

* * * * *